UUS009201297B2

(12) United States Patent
Kikuchi et al.

(10) Patent No.: US 9,201,297 B2
(45) Date of Patent: Dec. 1, 2015

(54) TEMPLATE AND PATTERN FORMING METHOD

(75) Inventors: Yukiko Kikuchi, Fujisawa (JP); Shinichi Ito, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/480,905

(22) Filed: May 25, 2012

(65) Prior Publication Data

US 2012/0231629 A1   Sep. 13, 2012

Related U.S. Application Data

(62) Division of application No. 12/760,282, filed on Apr. 14, 2010.

(30) Foreign Application Priority Data

Sep. 24, 2009   (JP) .................................. 2009-219687

(51) Int. Cl.
  *B29C 59/02* (2006.01)
  *G03F 7/00* (2006.01)
  *H01L 21/768* (2006.01)
  (Continued)

(52) U.S. Cl.
  CPC ........ *G03F 7/0002* (2013.01); *H01L 21/76838* (2013.01); *H01L 24/03* (2013.01); *H01L 24/05* (2013.01); *H01L 23/544* (2013.01); *H01L 23/585* (2013.01); *H01L 2224/05599* (2013.01); *H01L 2924/00014* (2013.01); *H01L 2924/01004* (2013.01); *H01L 2924/01005* (2013.01); *H01L 2924/01006* (2013.01); *H01L 2924/01014* (2013.01); *H01L 2924/01023* (2013.01); *H01L 2924/01033* (2013.01); *H01L 2924/01082* (2013.01)

(58) Field of Classification Search
  CPC ... G03F 7/0002; G03F 7/0037; G03F 7/0017; B29C 33/42; B29C 33/424; B29C 2033/422; B29C 2033/424; B29C 2033/436
  USPC .................................. 264/496, 293; 425/385
  See application file for complete search history.

(56) References Cited

U.S. PATENT DOCUMENTS

2005/0045583 A1\* 3/2005 Fujita et al. ..................... 216/44
2005/0126470 A1\* 6/2005 Herman et al. .................. 117/2
(Continued)

FOREIGN PATENT DOCUMENTS

JP   2000-194142   7/2000
JP   2001-068411   3/2001
(Continued)

OTHER PUBLICATIONS

Notification of Reasons for Rejection mailed by the Japanese Patent Office on Nov. 30, 2010, for Japanese Patent Application No. 2009-219687 and English-language translation thereof.

*Primary Examiner* — Timothy Kennedy
(74) *Attorney, Agent, or Firm* — Finnegan, Henderson, Farabow, Garrett & Dunner, LLP

(57) ABSTRACT

A template for imprinting in which a pattern is transferred onto a first substrate applied curable resin thereon, including a second substrate having a surface to be contacted with the curable resin, a concave portion provided on the surface and corresponding to a pattern to be transferred onto the first substrate, and at least one convex portion arranged in the concave portion to decrease volume of the concave portion.

8 Claims, 8 Drawing Sheets

(51) Int. Cl.
*H01L 23/00* (2006.01)
*H01L 23/544* (2006.01)
*H01L 23/58* (2006.01)

(56) References Cited

U.S. PATENT DOCUMENTS

| | | |
|---|---|---|
| 2005/0214661 A1* | 9/2005 | Stasiak et al. .................... 430/22 |
| 2006/0021967 A1* | 2/2006 | Lee ................................. 216/41 |
| 2006/0230959 A1 | 10/2006 | Meijer et al. |
| 2008/0073604 A1 | 3/2008 | Suehira et al. |
| 2008/0214010 A1* | 9/2008 | Yoneda et al. ................. 425/500 |
| 2008/0217822 A1* | 9/2008 | Chou et al. .................... 264/496 |

FOREIGN PATENT DOCUMENTS

| | | |
|---|---|---|
| JP | 2003-217187 | 7/2003 |
| JP | 2005-71487 | 3/2005 |
| JP | 2007-230229 | 9/2007 |
| WO | WO 2008/072319 | 6/2008 |

* cited by examiner

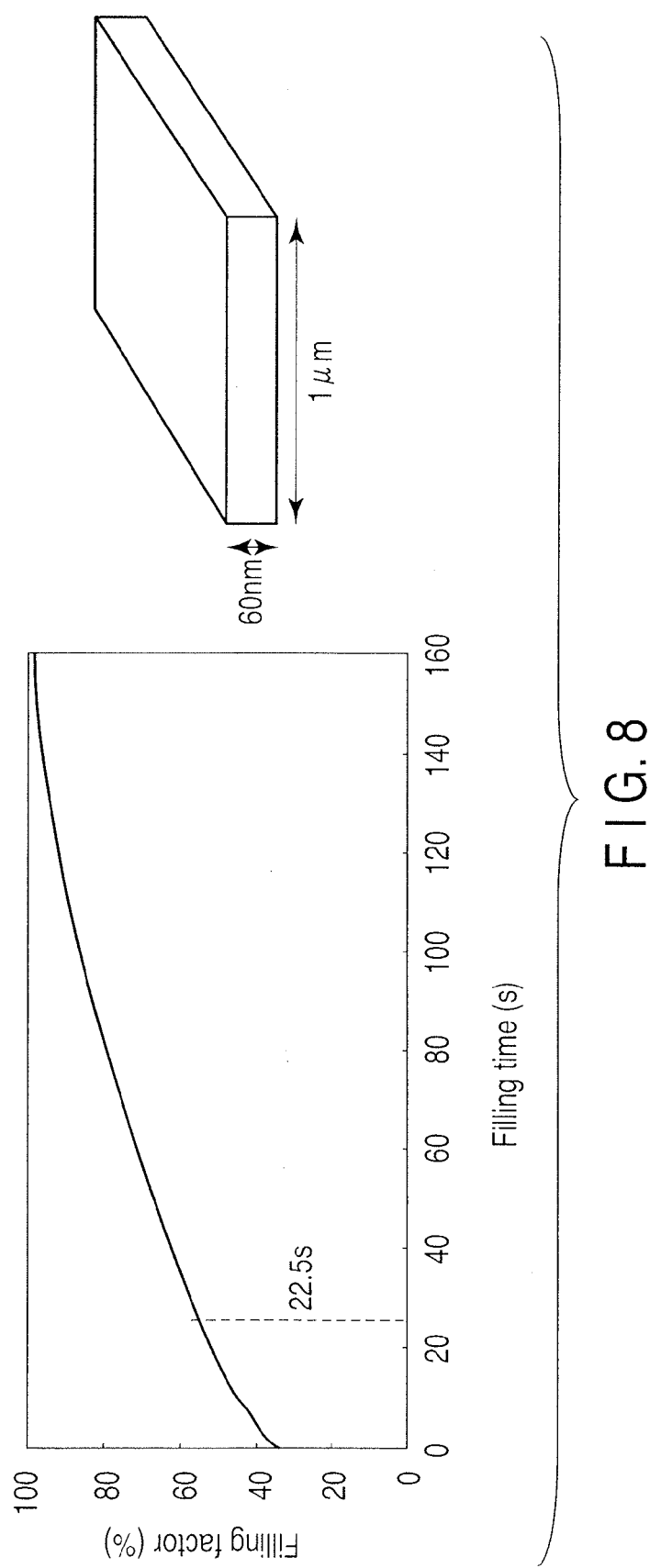
F I G. 8

TEMPLATE AND PATTERN FORMING METHOD

This is a divisional of application Ser. No. 12/760,282, filed Apr. 14, 2010, which is incorporated herein by reference.

CROSS-REFERENCE TO RELATED APPLICATIONS

This application is based upon and claims the benefit of priority from prior Japanese Patent Application No. 2009-219687, filed Sep. 24, 2009, the entire contents of which are incorporated herein by reference.

BACKGROUND OF THE INVENTION

1. Field of the Invention

The present invention relates to a template for imprint and a pattern forming method.

2. Description of the Related Art

An imprint technique has attracted interests as one technique of achieving both forming a fine pattern and improving mass productivity. According to the imprint technique, a template mold is transferred onto a substrate to be processed.

An optical (UV) imprint is given as one of imprint techniques (e.g., see Jpn. Pat. Appln. KOKAI publications No. 2001-068411 and No. 2000-194142). The optical imprint method includes a step of applying light curable organic resin onto a substrate, a step of aligning the substrate and the template, a step of contacting the light curable resin with the template, a step of curing the light curable organic resin by irradiation of light, and a step of separating the template from the cured light curable organic resin (demold).

In the conventional imprint, depending on size or shape of concave/convex patter formed on the template (template pattern), a part of concave portions of the template pattern is not filled with the light curable organic resin. The part not filled with the resin causes a pattern defect (unfilled defect).

In order to be free from the unfilled defect, the concave portion of the template pattern needs to be completely filled with the light curable organic resin by taking long time from the contacting the template with the light curable organic resin to the irradiation of light (filling time).

However, if the filling time of the light curable organic resin is set longer as described above, a problem of reducing throughput arises.

BRIEF SUMMARY OF THE INVENTION

According to an aspect of the present invention, there is provided a template used for imprinting in which a pattern is transferred onto a first substrate applied curable resin thereon, comprising: a second substrate having a surface to be contacted with the curable resin; a concave portion provided on the surface and corresponding to a pattern to be transferred onto the first substrate; and at least one convex portion arranged in the concave portion to decrease volume of the concave portion.

According to an aspect of the present invention, there is provided a pattern forming method comprising: applying curable resin on a first substrate; contacting the curable resin with a template wherein the template comprises a second substrate having a surface to be contacted with the curable resin, a portion provided on the surface and corresponding to a pattern to be transferred onto the first substrate, and at least one convex portion arranged in the concave portion to decrease volume of the concave portion; curing the curable resin; separating the template from the cured curable resin to form a pattern of the cured curable resin; and etching the first substrate by using the pattern of the cured curable resin as a mask to form a pattern on the first substrate.

BRIEF DESCRIPTION OF THE SEVERAL VIEWS OF THE DRAWING

FIG. 8 is a graph showing a relationship between filling time and filling factor in a case of box type concave portion;

DETAILED DESCRIPTION OF THE INVENTION

Various embodiments will be hereinafter described with reference to the accompanying drawings.

First Embodiment

Figure 1:
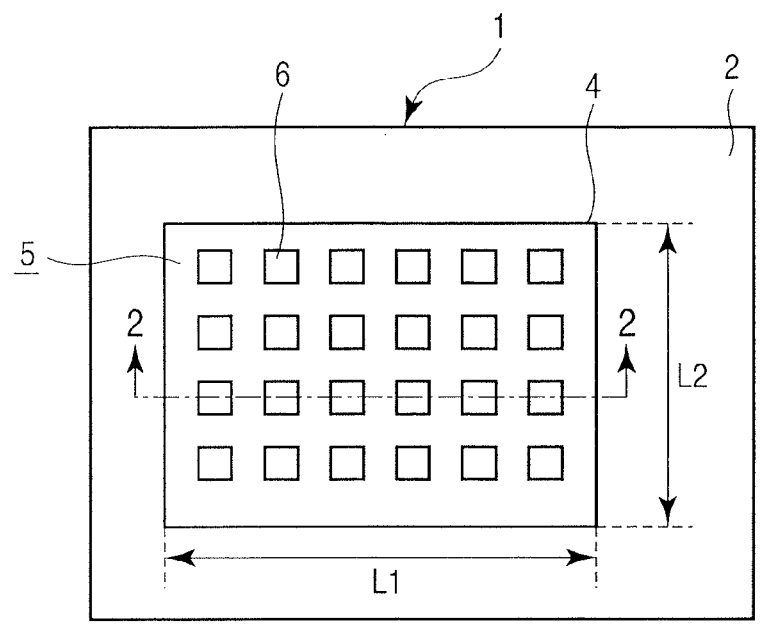
FIG. 1 is a plan view showing a template according to a first embodiment.
Figure 2:
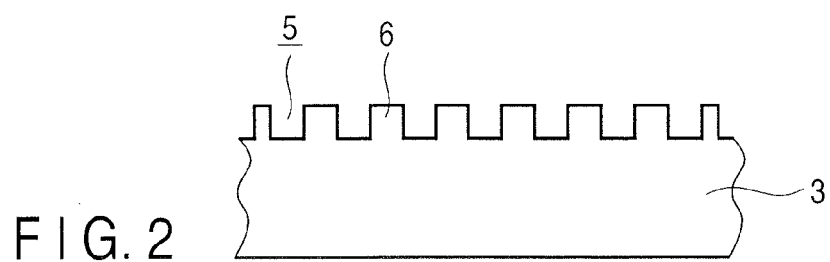
FIG. 2 is a cross-sectional view taken along the line 2-2' of FIG. 1.

FIG. 1 is a plan view showing a template according to a first embodiment. FIG. 2 is a cross-sectional view taken along the line 2-2' of FIG. 1.

A template 1 of the present embodiment is directed to use for imprinting in which a pattern is transferred onto light curable organic resin applied on a substrate (first substrate) to be processed. The type of imprint is, for example, optical (UV) imprint, or thermal imprint.

The template 1 comprises a substrate (second substrate) having a surface to be contacted with the light curable organic resin, a concave portion 5 provided on the surface 2 and having a contour 4 corresponding to a pattern to be transferred on the substrate, and convex portions 6 arranged in the concave portion 5 for reducing volume of the concave portion 5 (space).

Here, the concave portion 5 has a contour 4 corresponding to the contour of the pattern to be transferred onto the substrate.

The pattern to be transferred onto the substrate includes a large pattern. For example, the large pattern has a large dimension of 100 nm or more.

Examples of the large pattern includes a pad, a dummy pattern, or a mark. The dummy pattern is formed in a low density pattern area (sparse pattern area) of the substrate. That is, variation of the pattern density in an in-plane of the substrate is reduced. Thereby, flatness in the in-plane of the substrate after chemical mechanical polishing (CMP) is improved. Moreover, the mark is, for example, an alignment mark.

In the present embodiment, the contour of the pattern to be transferred onto the substrate is same as that of rectangular. Therefore, the contour 4 of the concave portion 5 has a shape (rectangle or substantially rectangle) corresponding to that of the rectangle. That is, the concave portion 5 has the contour corresponding to the contour of the pattern to be transferred onto the substrate. At least one of two contour line dimensions L1 and L2 defining the contour 4 is 100 nm or more.

In the concave portion 5, the convex portions 6 are arranged in a matrix layout (regular arrangement). FIG. 1 shows a 4×6 matrix layout, however, it is not limited to the number of row (4 in FIG. 1) and columns (6 in FIG. 1).

Figure 3:
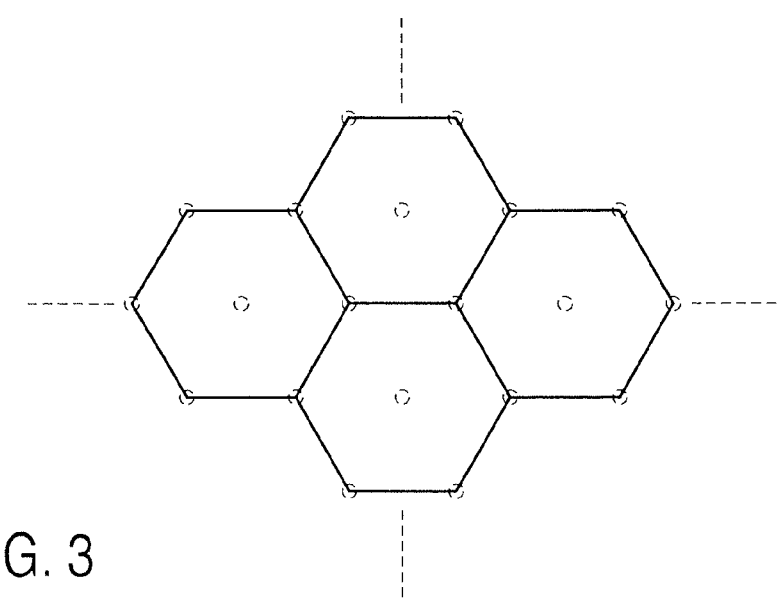
FIG. 3 is a plan view showing a honeycomb arrangement.

In addition, the concave portions 6 are not limited to the matrix layout (regular arrangement). For example, a honeycomb layout is given as another regular arrangement except the matrix layout. In the honeycomb layout, as seen from FIG. 3, the vertex and center of a regular hexagon constituting the honeycomb structure (structure having hexagons arranged without a gap) are set as the arrangement position. In FIG. 3, the vertexes and centers are shown by dotted-line circles. In FIG. 3, four regular hexagons are show, however, the number of regular hexagons constituting the honeycomb structure is not specially limited.

In addition, the convex portions 6 may be an irregular arrangement. The irregular arrangement includes a random arrangement, or an arrangement mixing the random arrangement and the regular arrangement.

In this way, the arrangement of the concave portions 6 is not specially limited, and it may be variously changed so long as the large pattern can perform its own original function such as a pad, a dummy pattern, or a mark.

A method of forming the convex portions 6 include a step of applying resist on the substrate 3, a step of exposing the resist by a electron beam (EB), a step of developing the resist exposed by the EB, a step of etching the substrate 3 by using the developed resist (resist pattern) as a mask. In the case optical imprint, the substrate 3 is a quartz substrate (transparent substrate).

Figure 4:
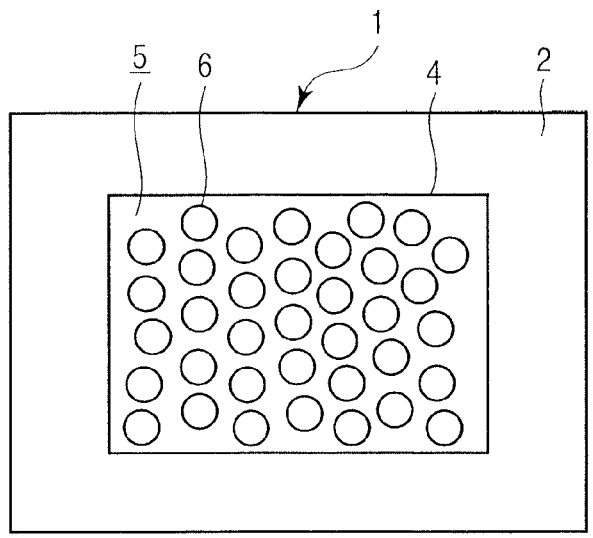
FIG. 4 is a plan view showing a template having a convex portion whose plane shape is circular.

In addition, though the convex portions 6 having plane shapes (overhead views from the face 2) of square are shown in FIG. 1, the shapes of the convex portions 6 may be variously changed so long as the large pattern can perform its own original function such as a pad, a dummy pattern, or a mark. For example, as shown in FIG. 4, the plane shapes (overhead views from the face 2) of convex portion 6 may be circular plane shapes. In FIG. 4, the convex portions 6 are arranged as a honeycomb layout. The convex portions 6 having such the plane shapes and the layout can be formed by using self-assembled technique such as a block copolymer for instance.

Figure 5:
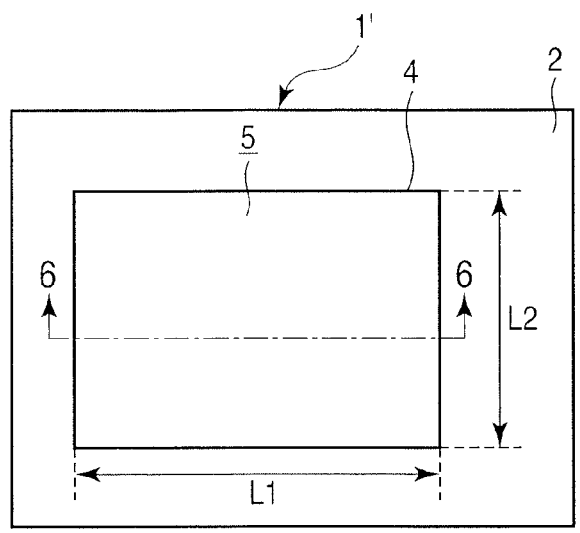
FIG. 5 is a plan view showing conventional template.
Figure 6:
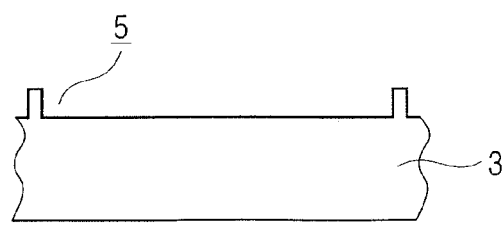
FIG. 6 is a cross-sectional view taken along the line 6-6' of FIG. 5.

FIGS. 5 and 6 show plan view and cross-sectional view of a conventional template. FIGS. 5 and 6 correspond to FIGS. 1 and 2, respectively. In the following figures, the portions corresponding to the portions shown in the previously mentioned drawings are denoted by the same reference numerals and omitted its detail explanation.

In the case of the template 1 of the present embodiment, the convex portions 6 are arranged in the concave portion 5 which corresponds to a pattern to be transferred onto the substrate. However, in the case of the conventional template 1', the convex portions are not arranged in the concave portion 5.

Here, the template 1 of the resent embodiment has the smaller volume of the concave portion 5 (space) than conventional template 1' by n×V, where n is the number of convex portions 6, and V is the volume of convex portions 6.

Therefore, according to the present embodiment, the resin amount required for filling the concave portion 5 with the curable material is reduced compared to the conventional case, consequently, the time required for filling the concave portion 5 with the curable material (filling time) is shortened compared to the conventional case. In this way, according to the present embodiment, the reduction of filling time of the curable material is realized, thus the reduction of throughput is suppressed even in a case of forming the large pattern such as a pad.

In addition, since the filling time is shortened, the concave portion 5 is filled with the curable material within a predetermined time, thereby the generation of unfilled defect is effectively suppressed.

Figure 7:
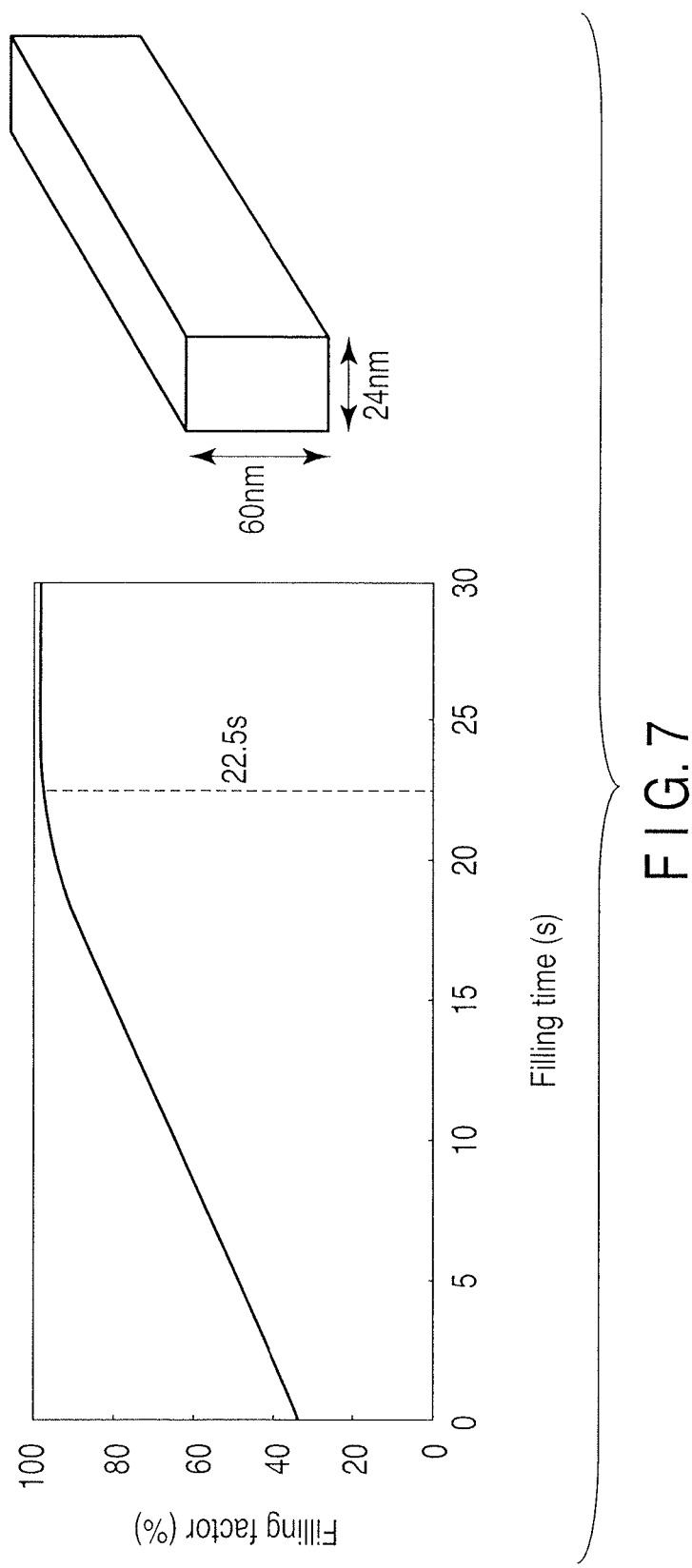
FIG. 7 is a graph showing a relationship between filling time and filling factor in a case of trench type concave portion.

For example, as shown in FIGS. 7 and 8, the concave portions having different volumes respectively are filled with the curable material within the predetermined time (22.5 seconds). FIG. 7 shows the relationship between the filling time and a filling factor in a rectangle-type concave portion having a width of 2 nm and a height of 60 nm. FIG. 8 shows the relationship between the filling time and the filling factor in a box-type concave portion having a width of 2 nm and a height of 60 nm.

Fine patterns other than large pattern patterns may be together formed on the template. In this case, filling time is determined considering the larger patterns and the fin patterns (non-large patter). The filling time (predetermined time) determined in the above manner is shorter than the filling time determined based on larger pattern only. According to the conventional technique, is difficult to fill large patterns within the filling time determined considering larger patterns and fin patterns (non-large patter) unlike the present embodiment.

Moreover, the filling time is easily controllable using the number n of convex portions 6 and the volume V thereof. It is easy to form the convex portion 6 having the predetermined volume by the desired number. Therefore, according to the present embodiment, it is possible to shorten the filling time of the curable materials without increasing the cost for forming the template, thereby the reduction of throughput is easily suppressed even in the case of forming the large patterns. In general, the more the number n and the more volume V are, the filling time becomes shorter.

In a case where the pattern to be transferred onto the substrate has an opening, the present embodiment provide a template comprising the convex portions arranged in the concave for reducing the volume in addition to a convex portion corresponding to the opening. However, the conventional template comprises no additional convex portions arranged in the concave though comprises the convex portion corresponding to the opening and arranged in the concave portion. That is, the conventional template is not provided with the convex portions for intentionally making the volume of original concave portion (pattern) to be transferred smaller.

Figure 9:
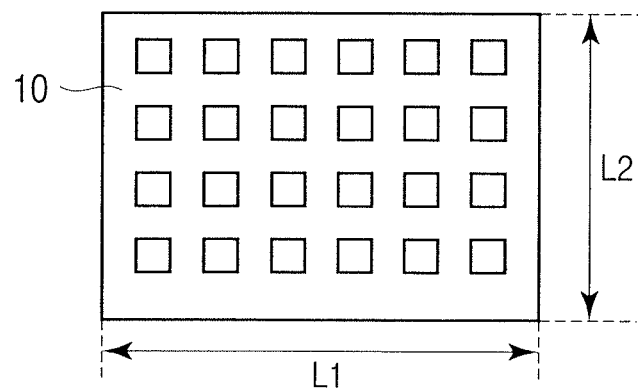
FIG. 9 is a plan view showing a pattern of curable material transferred onto a substrate to be processed (resin pattern) by using a template of an embodiment.

FIG. 9 is a plan view showing a pattern (resin pattern) of a curable material transferred onto a substrate to be processed by using the template 1 of the present embodiment. As seen from FIG. 9, the resin pattern 10 is one connected lattice pattern.

Figure 10:
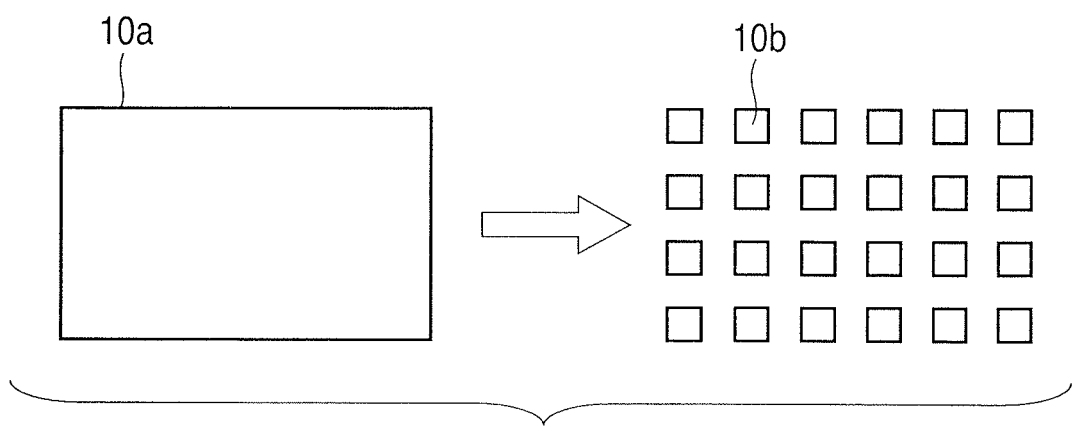
FIG. 10 is a view to explain a template of a comparison example.

Here, as shown in FIG. 10, the reduction of filling time is realizable even by dividing the resin pattern 10a into a plurality of resin patterns 10b (24 divisions in FIG. 9) (comparison example). That is, the reduction of filling time is realizable using a template having one concave portion divided into a plurality of concave portions.

In a case of the comparison example, the divisions result in decreasing the size of individual resin patterns 10, thus a contact area between the resin pattern 10b and its underlying (substrate) becomes small. As a result, after the curing, the resin pattern 10b tends to be easily peeled from the underlying layer, which results in difficulty of forming the desired pattern.

In contrast, in a case of the present embodiment, since the resin pattern 10 is one continuous pattern as described above, the decreasing of size of the resin pattern 10 is suppressed compared with the comparison example. As a result, the reduction of contact area between the resin pattern 10 and its underlying (substrate) is suppressed, then the adhesiveness between the resin pattern 10 and the underlying layer is secured. Therefore, it makes possible to form the desired pattern easily.

In this manner, according to the present embodiment, the filling time of the curable material is shortened without increasing the cost of forming the template, which brings a realization of the template for imprinting that enables both suppressing the reduction of throughput and forming the desired pattern with ease even in the case of forming the large pattern.

The following templates are given as a template capable of improving throughput, except the template of the present embodiment. One is a template which accelerates capillary effect by providing micro holes in an upper portion of the large pattern. Another is a template which varies depth of the concave portion in accordance with pattern dimensions.

However, these templates require a high accuracy and complicated processing method for forming thereof, and further, the processing of substrate must be three-dimensionally controlled. The control is technically very difficult.

In addition, the following problem remains even if the template (parent template) satisfying the standard is formed by using the high accuracy and complicated processing method. In the actual imprint process, many child templates are used. These child templates are formed by transferring pattern of the parent template onto another substrate. However, it is impossible to transfer the three-dimensional pattern of the parent template to another substrate at present.

The present embodiment relates to the case where the contour of the concave portion (pattern) to be transferred onto the substrate is rectangle, but the present embodiment is applicable to the case of transferring the concave portion (pattern) having a different contour from the above mentioned contour onto the substrate.

Figure 11A:
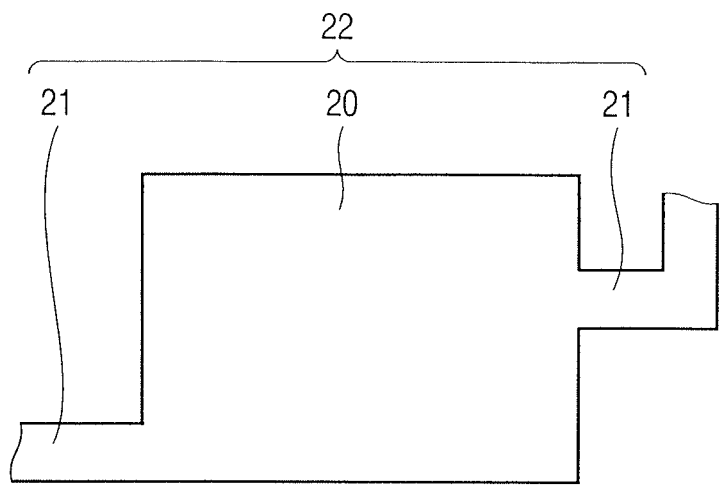
FIGS. 11A and 11B are views to explain a template having a pattern whose a contour is different from a rectangle in which the pattern is to be formed on a substrate to be processed.

For example, as shown in FIG. 11A, the present embodiment is applicable to a pattern 22 which comprises a large pattern 20 such as a pad or dummy pattern, and a non-large pattern (e.g., fine pattern) 21 such as an extracting wiring or a dummy extracting wiring connected to the large pattern 20.

Figure 11B:
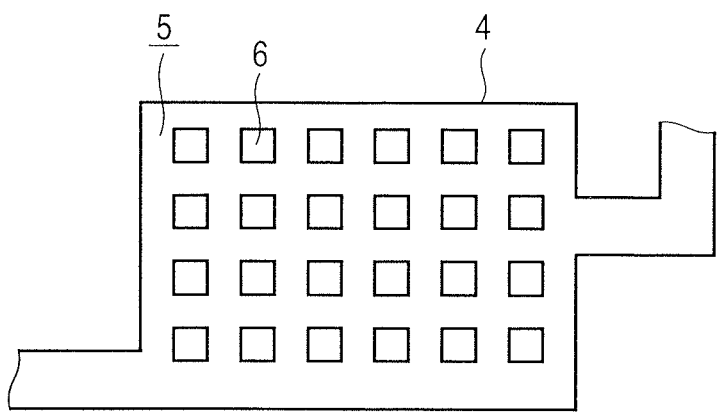
Figure 12:
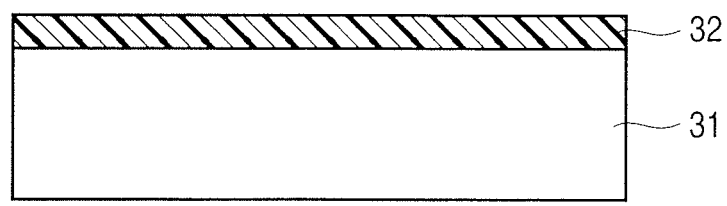
FIG. 12 is a cross-sectional view to explain a pattern forming method according to a second embodiment.
Figure 13:
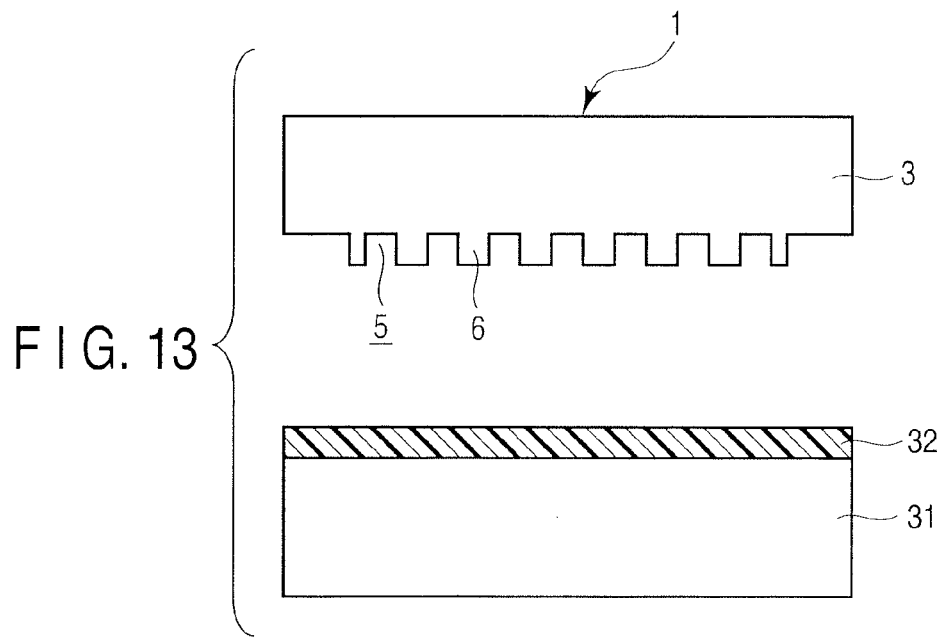
FIG. 13 is a cross-sectional view to explain the pattern forming method according to the second embodiment following FIG. 12.
Figure 14:
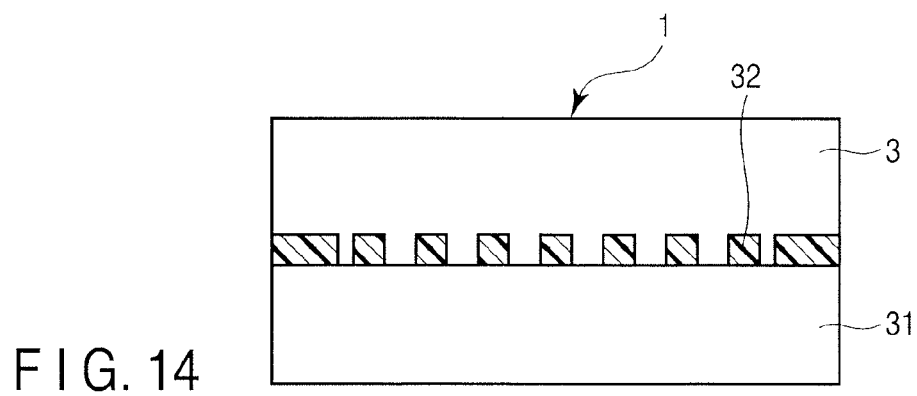
FIG. 14 is a cross-sectional view to explain the pattern forming method according to the second embodiment following FIG. 13.
Figure 15:
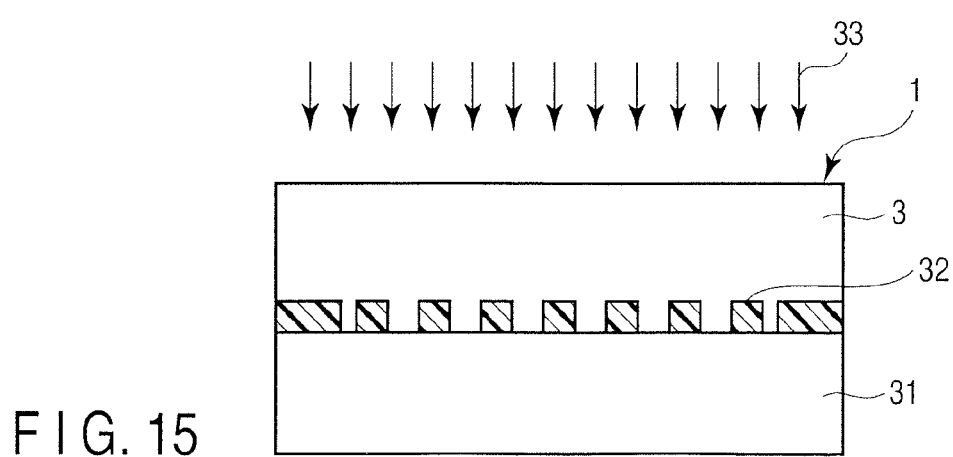
FIG. 15 is a cross-sectional view to explain the pattern forming method according to the second embodiment following FIG. 14.
Figure 16:
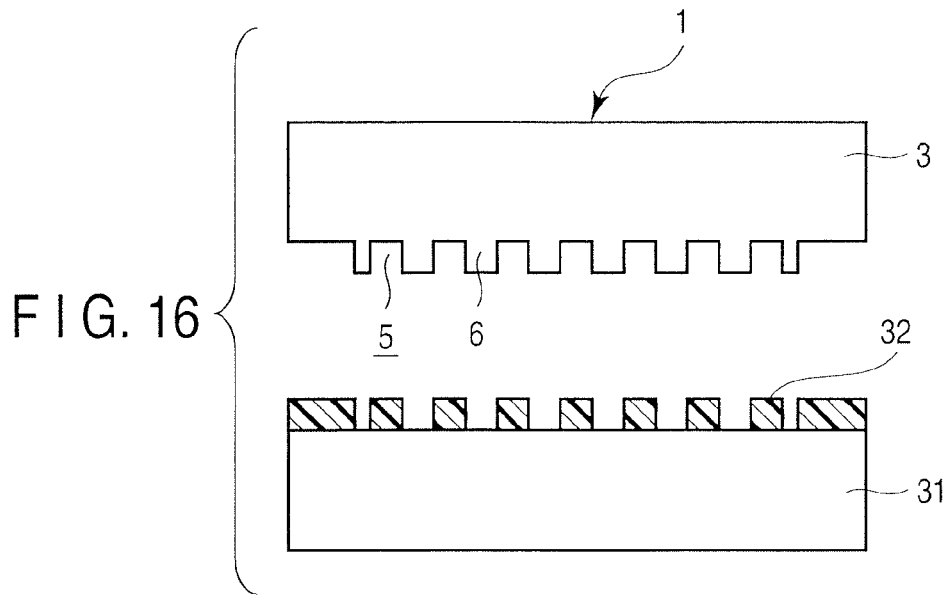
FIG. 16 is a cross-sectional view to explain the pattern forming method according to the second embodiment following FIG. 15.
Figure 17:
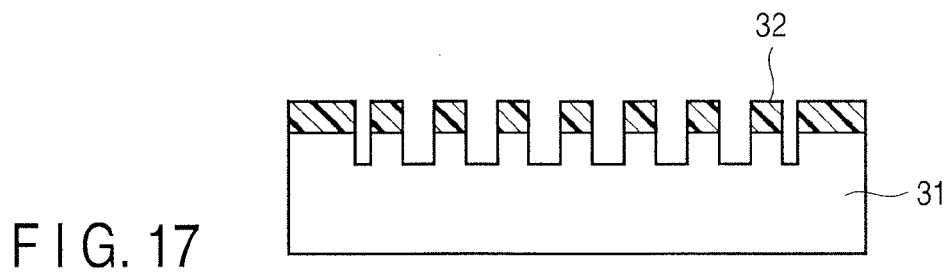
FIG. 17 is a cross-sectional view to explain the pattern forming method according to the second embodiment following FIG. 16.

In this case, as shown in FIG. 11B, the template comprises the concave portion 5 having the contour 4 corresponding to the contour of the pattern 22 (20, 21) to be transferred onto the substrate, and the plurality of convex portions 6 arranged in the concave portion 5 corresponding to the large pattern 20. The convex portions 6 are not arranged in the concave portion 5 corresponding to the non-large pattern 21.

Second Embodiment

FIGS. 12 to 17 are cross-sectional views to explain a pattern forming method according to a second embodiment. In the present embodiment, a pattern forming method by optical imprint using the template described in the first embodiment.

[FIG. 12]

Light curable material 32 is applied on a substrate 31 to be process. The substrate 31 is, for example, a silicon substrate (semiconductor substrate). The substrate 31 includes a semiconductor substrate and a conductive film provided thereon (the substrate of multilayer structure) for instance.

[FIG. 13]

The substrate 31 is aligned with the template 1 of the first embodiment. Here, the description takes place in a case of using the template 1 shown in FIG. 1, but other cases of using other templates described in the first embodiment are same as the present embodiment.

[FIG. 14]

The template 1 is contacted with the light curable material 32, and the concave portions of template pattern formed on a main surface of the template 1 is filled with the light curable material 32.

[FIG. 15]

The light curable material 32 is irradiated with light 33 coming from a rear surface of the template 1 (a surface oppose to the surface contacting the light curable material 32), and the light curable material 32 is cured. The wavelength of the light 33 is within a wavelength range from UV to EUV, for example.

[FIG. 16]

The template 1 is separated from the light curable material 32.

[FIG. 17]

The substrate 31 is etched by using the light curable material 32 (resin pattern) remained on the substrate 31 as an etching mask, and thus, a pattern is formed on the substrate 31. Thereafter, the light curable material 32 is removed.

Figure 18:
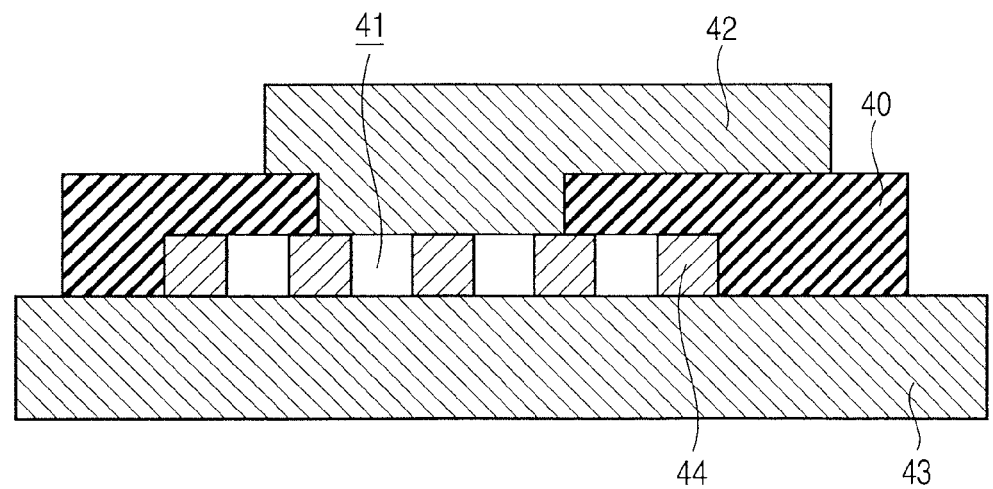
FIG. 18 is a cross-sectional view showing an example of a pattern formed by the pattern forming method of the second embodiment.

In a case where the substrate is of multilayer structure, for example, in a case of semiconductor substrate/conductive film, the conductive film is etched, and a pad as the large pattern is formed for instance. The pad has one continuous lattice pattern corresponding to the resin pattern 10 shown in FIG. 9. Thus, if an upper conductive layer and a lower conductive layer are connected at somewhere in the lattice area of the pad (area other than hole), for example, as shown in FIG. 18, the upper and lower layers 42 and 43 are electrically connected via a pad 44 by forming a hole 41 in an interlayer insulating film 40 larger than above mentioned hole. That is, the pad formed by the method of the present embodiment performs original function of pad.

Embodiments of the present invention have been described, but the present invention is not limited to the foregoing embodiments. For example, all of the plurality of convex portions dose not necessarily have the same dimensions.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A pattern forming method comprising:

applying a curable resin on a first substrate;

contacting the curable resin with a template which is used for imprinting in which a pattern is transferred onto the curable resin applied on the first substrate, wherein the pattern comprises a large pattern of a pad, a dummy pattern, or a mark having a dimension of 100 nm or more, and a fine pattern smaller than the large pattern, the fine pattern having a connecting wiring pattern formed in a first direction or a dummy connecting wiring pattern formed in the first direction, the connecting wiring pattern or the dummy connecting wiring pattern being connected to the large pattern, the template comprising:

a second substrate having a surface to be contacted with the curable resin;

a first convex portion configured to surround an area of the surface, the area and the first convex portion defining a concave portion, a contour of the concave portion corresponding to a contour of the large pattern and the fine pattern to be transferred onto the curable resin; and a plurality of second convex portions arranged in the concave portion and configured to decrease volume of the concave portion of the large pattern, the plurality of second convex portions being arranged in first and second directions, the second direction being nonparallel to the first direction, the concave portion being not divided into closed areas by the plurality of second convex portions;

curing the curable resin;

separating the template from the cured curable resin to form the pattern of the cured curable resin; and transferring the pattern of the cured curable resin to the first substrate.

2. The method according to claim 1, wherein the second convex portions arranged in the first directions and the connecting wiring pattern are formed on a same line.

3. The method according to claim 1, wherein the plurality of second convex portions are not formed in the concave portion of the fine pattern.

4. The method according to claim 1, wherein the concave portion of the fine pattern is outside the concave portion of the large pattern.

5. The method according to claim 1, wherein the second substrate, the first convex portion and the plurality of second convex portions are made of quartz.

6. The method according to claim 1, wherein the plurality of second convex portions are regularly arranged in the concave portion.

7. The method according to claim 1, wherein intervals of the plurality of second convex portions are smaller than a width of the fine pattern.

8. A pattern forming method comprising:

applying a curable resin on a first substrate;

contacting the curable resin with a template which is used for imprinting in which a pattern is transferred onto the curable resin applied on the first substrate, wherein the pattern comprises a large pattern of a pad, a dummy pattern, or a mark having a dimension of 100 nm or more, and a fine pattern smaller than the large pattern, the fine pattern having a connecting wiring pattern formed in a first direction or a dummy connecting wiring pattern formed in the first direction, the connecting wiring pattern or the dummy connecting wiring pattern being connected to the large pattern, the template comprising:

a second substrate having a surface to be contacted with the curable resin;

a first convex portion configured to surround an area of the surface, the area and the first convex portion defining a concave portion, a contour of the concave portion corresponding to a contour of the large pattern and the fine pattern to be transferred onto the curable resin; and a plurality of second convex portions arranged in the concave portion and configured to decrease volume of the concave portion of the large pattern, the plurality of second convex portions being arranged in first and second directions, the second direction being nonparallel to the first direction, the concave portion being not divided into closed areas by the plurality of second convex portions, intervals of the plurality of second convex portions being smaller than a width of the fine pattern, the plurality of second convex portions being regularly arranged in the concave portion, intervals of the plurality of second convex portions being smaller than a width of the fine pattern, the plurality of second convex portions being not formed in the concave portions of the fine pattern;

curing the curable resin;

separating the template from the cured curable resin to form the pattern of the cured curable resin; and transferring the pattern of the cured curable resin to the first substrate.

* * * * *